United States Patent
Lee

(10) Patent No.: US 9,786,766 B2
(45) Date of Patent: Oct. 10, 2017

(54) METHODS OF FABRICATING TRANSISTORS WITH A PROTECTION LAYER TO IMPROVE THE INSULATION BETWEEN A GATE ELECTRODE AND A JUNCTION REGION

(71) Applicant: SK hynix Inc., Gyeonggi-do (KR)

(72) Inventor: Jang Uk Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 247 days.

(21) Appl. No.: 14/643,695

(22) Filed: Mar. 10, 2015

(65) Prior Publication Data

US 2015/0187911 A1    Jul. 2, 2015

Related U.S. Application Data

(62) Division of application No. 13/845,857, filed on Mar. 18, 2013, now abandoned.

(30) Foreign Application Priority Data

Dec. 18, 2012    (KR) .................. 10-2012-0148668

(51) Int. Cl.
  *H01L 29/66*    (2006.01)
  *H01L 29/78*    (2006.01)
  *H01L 29/423*    (2006.01)
  *H01L 21/28*    (2006.01)
  *H01L 29/40*    (2006.01)
(52) U.S. Cl.
  CPC .... *H01L 29/66666* (2013.01); *H01L 21/2815* (2013.01); *H01L 29/401* (2013.01); *H01L 29/4236* (2013.01); *H01L 29/42368* (2013.01); *H01L 29/7827* (2013.01)

(58) Field of Classification Search
  None
  See application file for complete search history.

(56) References Cited

U.S. PATENT DOCUMENTS

| | | | | |
|---|---|---|---|---|
| 7,368,352 B2* | 5/2008 | Kim | .................. | H01L 27/10876 257/296 |
| 7,999,313 B2* | 8/2011 | Kim | .................. | H01L 21/82348 257/331 |
| 8,486,819 B2* | 7/2013 | Kim | .................. | H01L 27/10876 257/412 |

(Continued)

FOREIGN PATENT DOCUMENTS

| CN | 1897305 | 1/2007 |
|---|---|---|
| CN | 101425515 | 5/2009 |
| CN | 101556954 | 10/2009 |

OTHER PUBLICATIONS

Huang et al.,"Low-k Spacers for Advanced Low Power CMOS Devices with Reduced Parasitic Capacitances", IEEE International SOI Conference Proceedings, pp. 19-20, 2008.*

*Primary Examiner* — Marc Armand
*Assistant Examiner* — Younes Boulghassoul
(74) *Attorney, Agent, or Firm* — IP & T Group LLP

(57) ABSTRACT

A semiconductor device includes a gate electrode formed on a sidewall of a structure extending from a semiconductor substrate. A junction region is form in the structure to a first depth from a top of the structure and formed to overlap the gate electrode. A protection layer is formed between an outer wall of the structure and the gate electrode to a second depth less than the first depth from the top of the structure.

5 Claims, 7 Drawing Sheets

(56) References Cited

U.S. PATENT DOCUMENTS

| | | |
|---|---|---|
| 2005/0242370 A1 | 11/2005 | Weber et al. |
| 2006/0091452 A1 | 5/2006 | Wu |
| 2007/0012996 A1* | 1/2007 | Yoon ................. H01L 27/10876 257/329 |
| 2007/0082448 A1 | 4/2007 | Kim et al. |
| 2009/0108341 A1* | 4/2009 | Chung .............. H01L 29/66666 257/329 |
| 2009/0114981 A1* | 5/2009 | Sung .................. H01L 29/7827 257/329 |
| 2009/0127609 A1 | 5/2009 | Han et al. |
| 2009/0170302 A1* | 7/2009 | Shin ................... H01L 29/4236 438/589 |
| 2011/0079836 A1* | 4/2011 | Lin ................... H01L 27/10826 257/306 |
| 2012/0001258 A1 | 1/2012 | Kim |

* cited by examiner

METHODS OF FABRICATING TRANSISTORS WITH A PROTECTION LAYER TO IMPROVE THE INSULATION BETWEEN A GATE ELECTRODE AND A JUNCTION REGION

CROSS-REFERENCES TO RELATED APPLICATION

This application is a division of U.S. patent application Ser. No. 13/845,857 filed on Mar. 18, 2013, which claims priority under 35 U.S.C. 119(a) to Korean application number 10-2012-0148668, filed on Dec. 18, 2012, in the Korean Patent Office. The disclosure of each of the foregoing application is incorporated by reference in its entirety.

BACKGROUND

1. Technical Field

The inventive concept relates to a semiconductor device, and more particularly, to a semiconductor device and a method of fabricating the same.

2. Related Art

A kind and application field of electronic apparatuses have been increasing day by day and ultra-high integration, ultra-high speed, and ultra-low power of memory devices, which are embedded in a limited size to process large capacity of data with high speed, have been required.

A unit memory cell is generally configured to include a data storage region and a selection device configured to access the data storage region. A diode, a transistor, or the like is used as the selection device. The transistor has advantageous to reduce an operation voltage through control of a threshold voltage lower than the diode.

Further, through application of a vertical structure to the transistor, the transistor has received attention again as the selection device of the memory device.

FIGS. 1 to 4 illustrate cross-sectional views illustrating a method of fabricating a conventional semiconductor device, for example, a vertical transistor.

First, as illustrated in FIG. 1, a semiconductor substrate 101, 103 includes a common source region 101 and is patterned to form a pillar structure 103. At this time, an etching process is performed on the semiconductor substrate. Without an etch stop layer, it is difficult to etch different portions of the substrate at the same rate. Therefore pillar structures 103 may have different heights A1 and A2.

FIG. 2 illustrates a gate insulating layer 105 that is formed along a surface of the pillar structures 103.

FIG. 3 shows that a conductive material is deposited on the semiconductor substrate, including the gate insulating layer 105, and is then etched to form a gate electrode 107 on an outer wall of the pillar structure 103.

As illustrated in FIG. 4, the pillar structure is divided into a channel region 103A and a drain region 103B through an impurity ion implantation process. Interlayer insulating layers 109 are formed between the pillar structures 103.

However, as illustrated in FIG. 1, the semiconductor substrate may be non-uniformly etched, and thus, the pillar structures 103 may have different heights A1 and A2. As illustrated in FIG. 3, gate electrodes 107 may have different heights due to non-uniform etching during the formation of the gate electrode 107.

Therefore, when an impurity is ion implanted to a predetermined projection range (RP) to form drain regions 103B, overlapping lengths B1, B2, and B3 between the gate electrodes 107 and the drain regions 103B may become different from each other.

However, if transistors have drain regions with different overlapping lengths, then operation characteristics of the transistors become different. Thus, the reliability of the semiconductor device is graded.

As the size of semiconductor devices has decreased, structures having increasingly high aspect ratios are being etched. Therefore, there is a greater need for uniform etching.

SUMMARY

An exemplary semiconductor device may include a gate electrode formed on a sidewall of a structure extending from a semiconductor substrate; a junction region formed in the structure to a first depth from a top of the structure and formed to overlap the gate electrode; and a protection layer formed between an outer wall of the structure and the gate electrode to a second depth less than the first depth from the top of the structure.

An exemplary semiconductor device may include a first junction region; a gate electrode formed in the first junction region; a channel region formed on the first junction region and extending along the gate electrode to a certain height, wherein the channel region is electrically connected to the first junction region; a second junction region formed on the channel region and extending along the gate electrode to a certain height, wherein the second junction region is electrically connected to the channel region; and a protection layer formed between the gate electrode and the second junction region, in a region where the gate electrode and the second junction region overlap.

An exemplary semiconductor device may include: a gate electrode formed in a trench formed in a semiconductor substrate; junction regions formed at both sides of the gate electrode; and a protection layer formed in the trench between the gate electrode and each of the junction regions, in a region where the gate electrode and each of the junction regions overlap.

An exemplary method of fabricating a semiconductor device may include patterning a semiconductor substrate to form preliminary pillars; forming a protection layer on each of the preliminary pillars; patterning the semiconductor substrate between the preliminary pillars to form pillar structures; forming a gate electrode on a sidewall of each of the pillar structures; and implanting an impurity into each of the pillar structures to a depth that is greater than a height of each of the preliminary pillars.

An exemplary method of fabricating a semiconductor device may include patterning a semiconductor substrate to form a preliminary trench; forming a protection layer in the preliminary trench; patterning the preliminary trench to form a trench in the semiconductor substrate; forming, to a certain depth, a gate electrode in the trench; and implanting an impurity into the semiconductor substrate to a depth that is greater than a depth of the preliminary trench.

These and other features, aspects, and embodiments are described below in the section entitled "DETAILED DESCRIPTION".

BRIEF DESCRIPTION OF THE DRAWINGS

The above and other aspects, features and other advantages of the subject matter of the present disclosure will be

DETAILED DESCRIPTION

Figure 1:
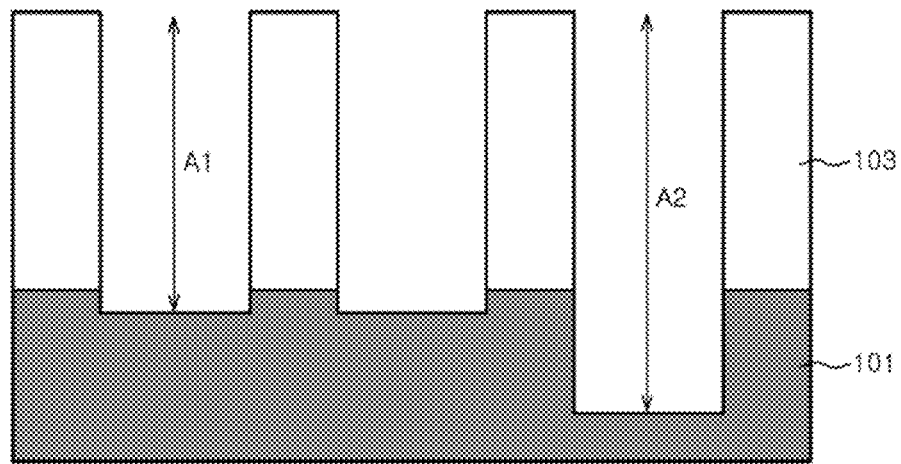
FIGS. 1 to 4 are cross-sectional views illustrating a method of fabricating a related semiconductor device.
Figure 2:
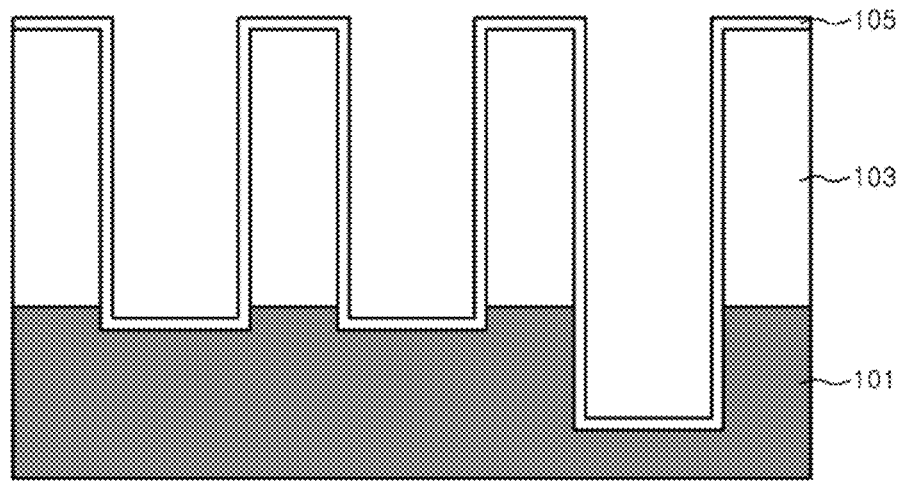
Figure 3:
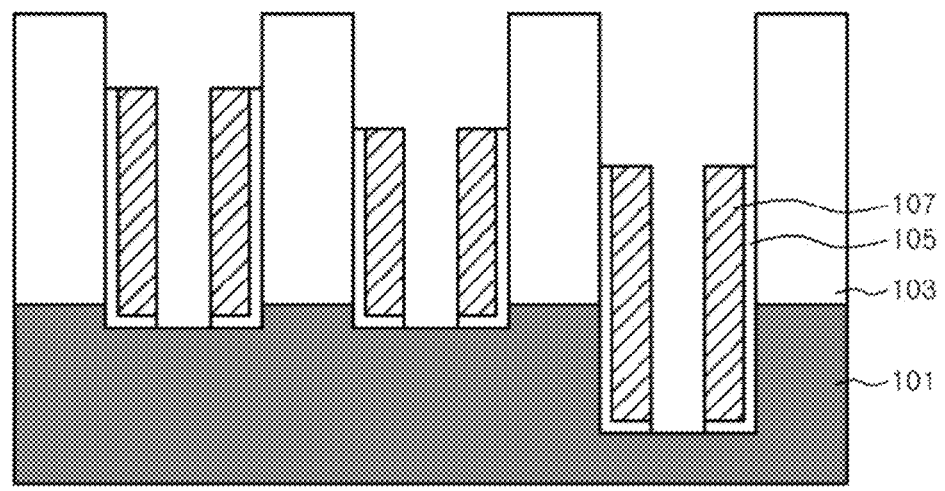
Figure 4:
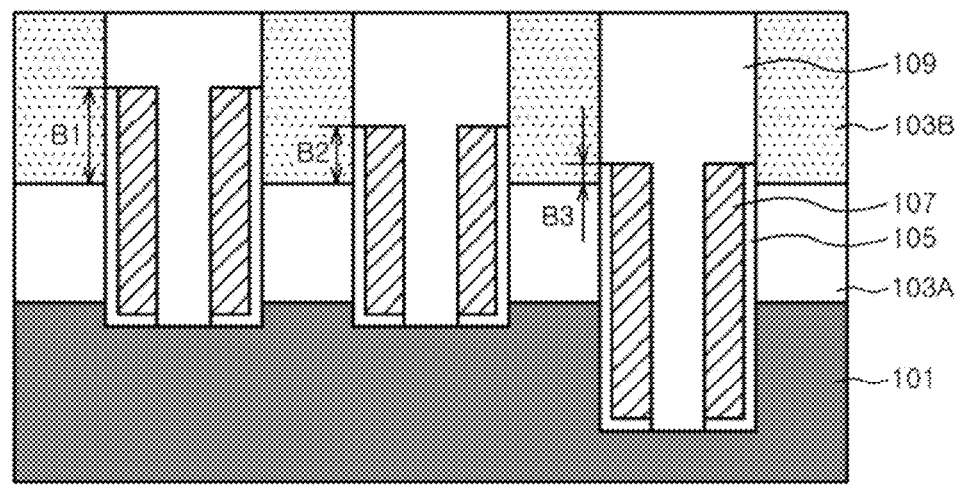

Hereinafter, exemplary embodiments will be described in greater detail with reference to the accompanying drawings.

Exemplary embodiments are described herein with reference to cross-sectional illustrations that are schematic illustrations of exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but may be to include deviations in shapes that result, for example, from manufacturing. In the drawings, lengths and sizes of layers and regions may be exaggerated for clarity. Like reference numerals in the drawings denote like elements. It is also understood that when a layer is referred to as being "on" another layer or substrate, it can be directly on the other or substrate, or intervening layers may also be present.

FIGS. 5 to 9 are views illustrating a method of fabricating an exemplary semiconductor device, such as a vertical transistor.

Figure 5:
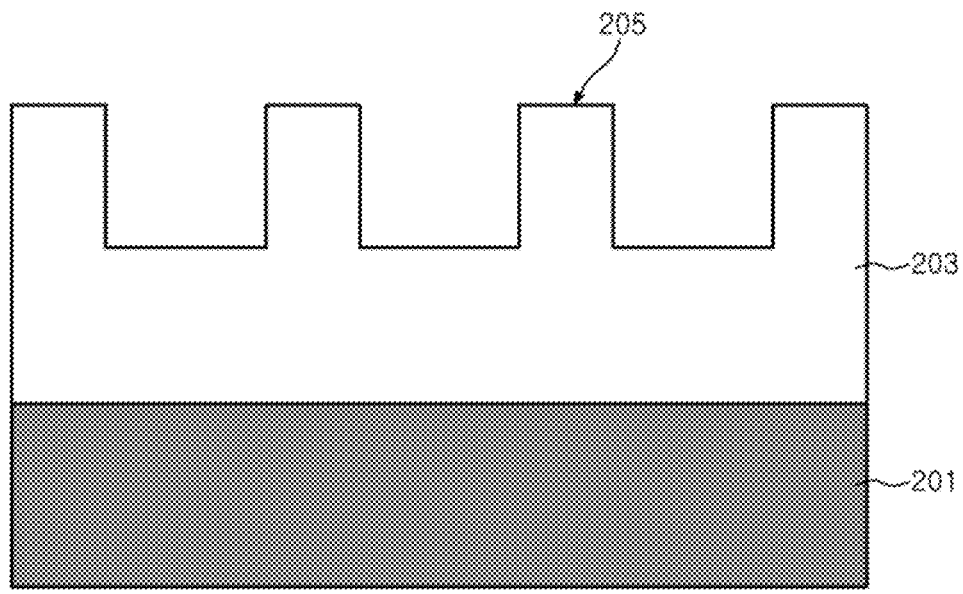
FIGS. 5 to 9 are cross-sectional views illustrating a method of fabricating an exemplary semiconductor device.

As illustrated in FIG. 5, a semiconductor substrate 203 which a first junction region 201 is formed, is provided. The semiconductor substrate 203 is etched by a predetermined first depth using a first hard mask (not shown) as an etch mask to form preliminary pillars 205. Here, the first junction region 201 may be a common source region. When forming the preliminary pillars 205, the semiconductor substrate 203 is etched to a depth that is less than a depth to which the semiconductor substrate is etched when forming pillar structures 209 (see FIG. 7). Therefore, deviations in heights of the preliminary pillars 205 are negligible, even when an etching process is performed without an etch stop layer.

Figure 6:
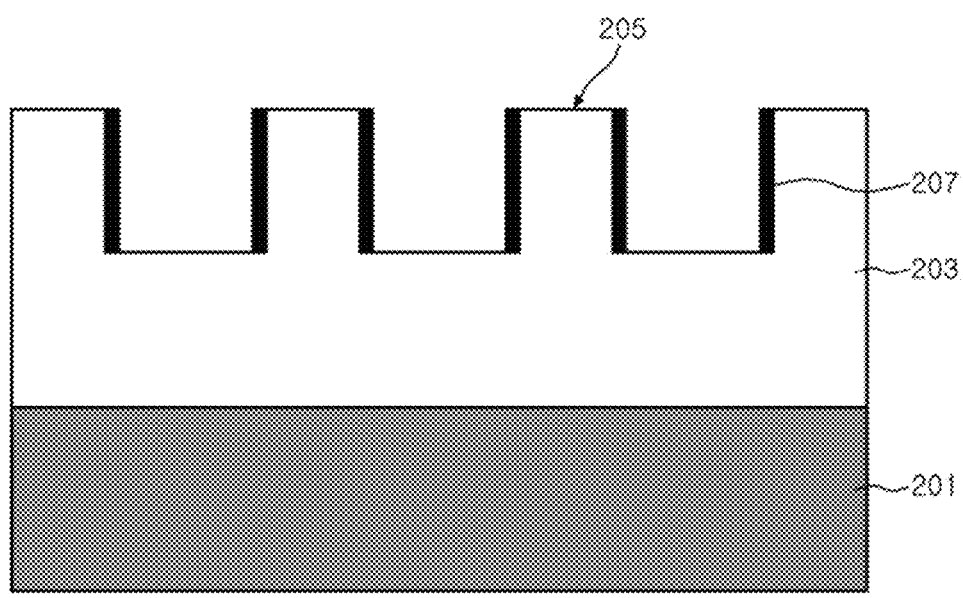

As illustrated in FIG. 6, the first mask pattern is removed and protection layers 207 are formed on the semiconductor substrate, including the preliminary pillars 205. The protection layer 207 may be formed, for example, of a nitride layer or an oxide layer, but the material for the protection layer 207 is not limited thereto. The protection layer 207 may be formed using a material having an oxidation rate larger than an oxidation rate of the semiconductor substrate 203, or may be formed using a material having a lower dielectric constant than a dielectric constant of a gate insulating layer 211 (to be formed in a subsequent process). Alternatively, the protection layers 207 may be processed to be more easily oxidized than the semiconductor substrate 203. Subsequently, a spacer etching process is performed on the protection layers 207, so that the protection layer 207 remains only on an outer circumference of the preliminary pillars 205.

Figure 7:
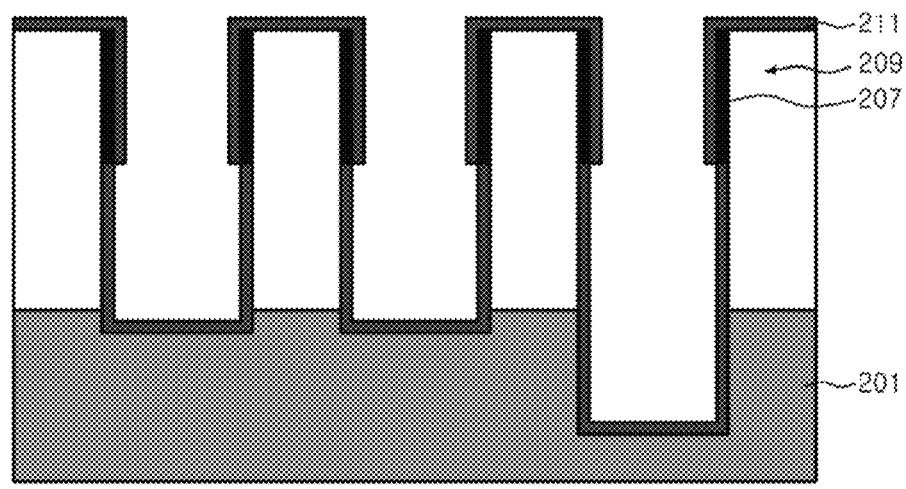

The semiconductor substrate 203 that is between the preliminary pillars 205 is etched to a second depth using a second hard mask (not shown) to form the pillar structures 209, as illustrated in FIG. 7. Then, the second hard mask is removed and a gate insulating layer 211 is formed on the semiconductor substrate including the pillar structures 209.

As can be seen from FIG. 7, since the semiconductor substrate 203 is etched to a deep depth without an etch stop layer, etch rates for etched portions become may become different, resulting in the pillar structures 209 having different heights, which is undesirable.

Figure 8:
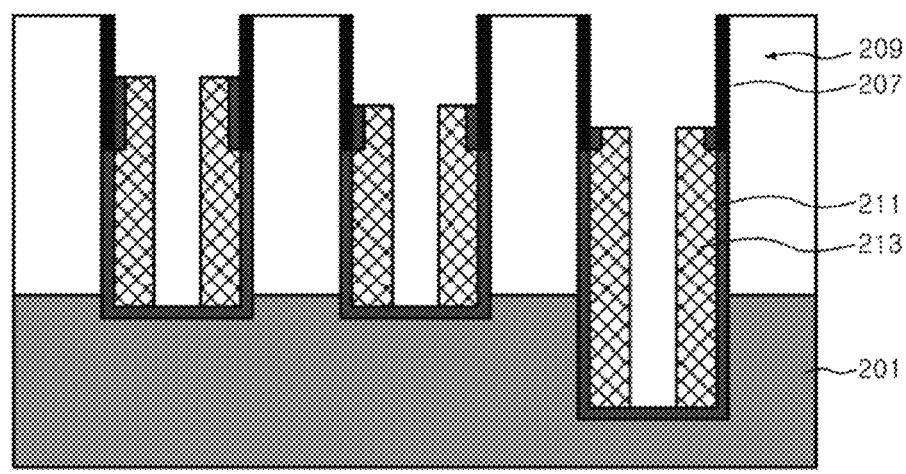

As illustrated in FIG. 8, a gate electrode material is formed on the semiconductor substrate, including the gate insulating layer 211, and a spacer etching process is performed on the gate electrode layer to form gate electrodes 213. That is, the gate electrodes 213 are formed on outer walls of the pillar structures 209. As can be seen in FIG. 8, after the spacer etching process, the gate electrodes 213 have different heights due to etching non-uniformity. Further, when the pillar structures 209 are formed to have different heights, it is more difficult to form the gate electrodes 213 having the same height.

Figure 9:
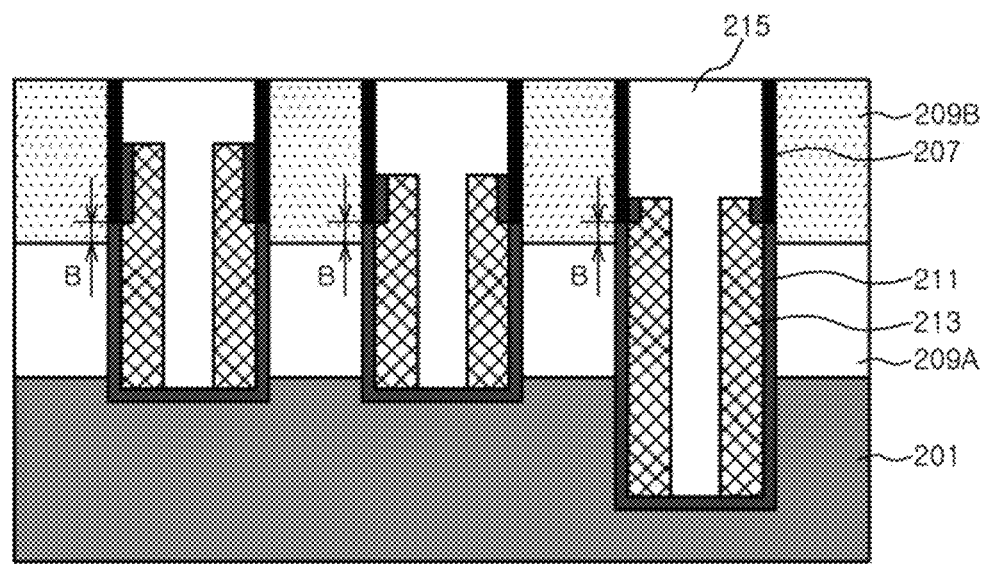

As illustrated in FIG. 9, an impurity is implanted to a preset projection range (RP) to divide each of the pillar structures 209 into a channel region 209A and a second junction region 209B, which may be a drain region. Interlayer insulating layers 215 are formed between and over the gate electrodes 213, to insulate between devices.

Outer walls of each of the pillar structures 209 may be covered with the protection layers 207 from tops of the pillar structures 209 to central portions of the pillar structures 209. The height of the protection layers 207 on the outer walls of each of the pillar structures may be the same as the heights of the preliminary pillars 205. Therefore, when the impurity is implanted to a predetermined depth, which is a depth larger than the heights of the preliminary pillars 205, regions B, where the gate electrodes 213, the gate insulating layers 212, and the second junction regions 209B overlap, are the same in all transistors.

Therefore, even when the pillar structures 209 are formed to have different heights or even when the gate electrodes 213 are formed to have different heights, the overlapping regions B, between the gate electrodes and the junction regions 209B may be uniformly maintained.

Further, if the protection layers 207 are formed of a material having an oxidation rate larger than that of the semiconductor substrate or if the protection layers 207 is processed to be more easily oxidized than the semiconductor device, then thicknesses of insulating material layers between the gate electrodes 213 and the second junction regions 209B in the overlapping regions of the gate electrodes 213, the gate insulating layers 211, the protection layers 207 and the second junction regions 209B are increased. Thus, an insulation effect may be improved. Further, when the protection layers 207, which have a low dielectric constant, are used, the insulation effect may be further improved.

The exemplary vertical semiconductor device, described above, includes a junction region on a side portion of a conductive layer (the gate electrode). However, the exemplary semiconductor device is not limited to a vertical transistor and may include other types of semiconductor devices, such as a buried gate transistor.

FIGS. 10 to 14 are cross-sectional views illustrating a method of fabricating an exemplary semiconductor device, such as a buried gate transistor.

Figure 10:
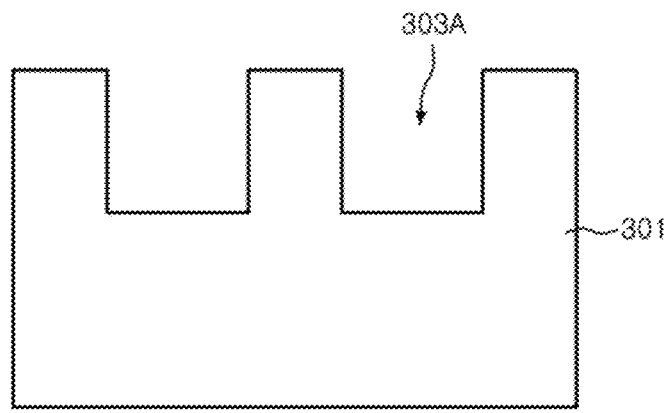
FIGS. 10 to 14 are cross-sectional views illustrating a method of fabricating an exemplary semiconductor device.

First, as illustrated in FIG. 10, a first hard mask (not shown) is formed on a semiconductor device 301 and the semiconductor substrate 301 is etched to a predetermined first depth to form preliminary trenches 303A.

Figure 11:
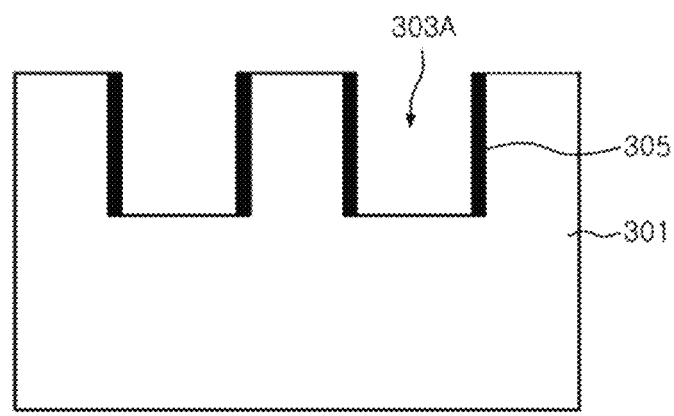

Subsequently, the first hard mask is removed. A protection material is formed on the semiconductor substrate having the preliminary trench 303A and is etched through a spacer etching process to form protection layers 305 on inner walls of the preliminary trenches 303A, as illustrated in FIG. 11. Here, the protection layers 305 may be formed using a material having an oxidation rate larger than that of the semiconductor substrate 301, or of a material having a dielectric constant smaller than that of a gate insulating layer 307 (to be formed in a subsequent process). Alternatively, the protection material may be processed to be oxidized easier than the semiconductor substrate 301.

Figure 12:
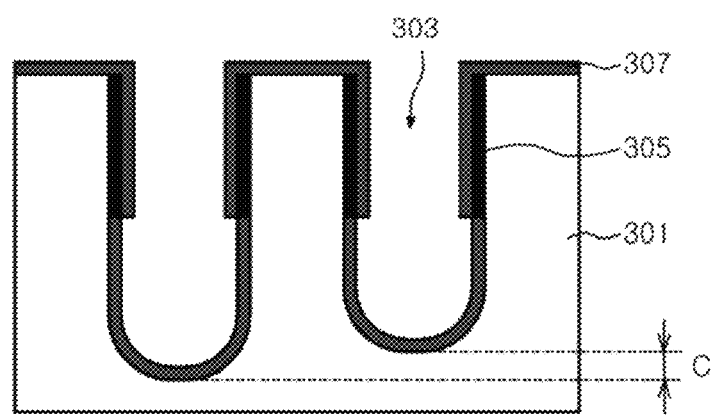
Figure 13:
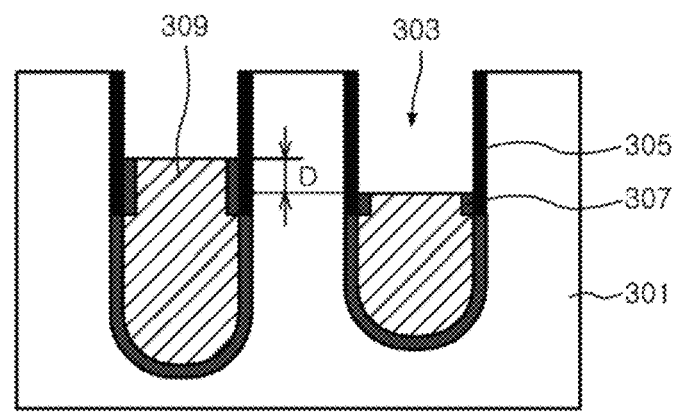

After the protection layers 305 are formed, a second hard mask (not shown) is formed and the semiconductor substrate 301 is etched to a predetermined second depth using the second hard mask to complete the trenches 303. As illustrated in FIG. 12, a gate insulating layers 307 are formed on the semiconductor substrate, including the trenches 303. Since the etching process for the formation of the trenches 303 is performed without an etch stop layer, the trenches 303 may have different depths, as indicated by "c," due to non-uniform etching.

If the protection layers 305 are formed using a material having an oxidation rate larger than that of the semiconductor substrate 301 or if the protection layers 305 are processed to be oxidized better than the semiconductor substrate 301, then thicknesses of the gate insulating layers 307, which are formed on the protection layers 305, may be larger than thicknesses of the gate insulating layers 307 formed on a surface of the semiconductor substrate 301.

As illustrated in 9G. 13, a conductive material is formed on the semiconductor substrate including, the gate insulating layers 307, and then blanket-etched to form a gate electrode 309 within each of the trenches 303. At this time, the etching rate may be controlled so that the depths of the gate electrodes 309 are deeper than bottom of the protection layers 305. In this case, when a blanket etching process for the formation of the gate electrodes 309 is performed, the gate electrodes 309 may have different buried heights as indicated by "D" due to non-uniform etching.

Figure 14:
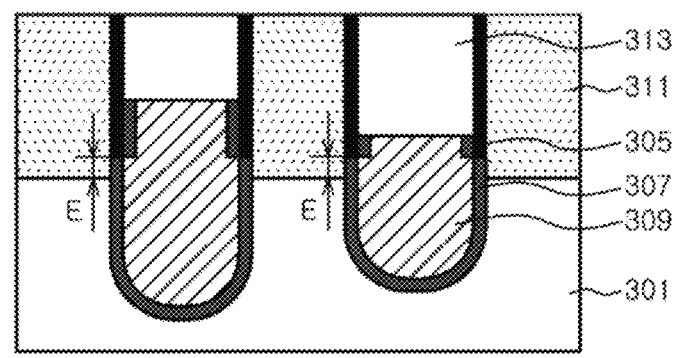

FIG. 14 illustrates that junction regions 311 are formed at both sides of each of the gate electrodes 309 by implanting an impurity. After the junction regions 311 are formed, interlayer insulating layers 313 are formed to isolate between devices.

In the exemplary embodiment, it can be seen that after the impurity is implanted, regions E, where the junction regions 311 overlap the gate electrode 309s and the gate insulating layers 311, have the same size in all the devices.

Thus, even if the pillars, the trenches or the gates have different heights, the overlapping regions E may be controlled to be same so that yield and operation reliability of the devices may be ensured.

As described above, the vertical transistor or the buried gate transistor has exemplarily described, but the semiconductor device is not limited thereto and a recess gate transistor may be formed using the inventive concept and the inventive concept may be applied to any semiconductor device in which a junction region is formed on a sidewall of a conductive layer.

The above described exemplary implementations are illustrative and not limitative. Various alternatives and equivalents are possible. The invention is not limited by the implementations described herein. Nor is the invention limited to any specific type of semiconductor device. Other additions, subtractions, or modifications its are obvious in view of the present disclosure and are intended to fall within the scope of the appended claims.

What is claimed is:

1. A method of fabricating a semiconductor device, the method comprising:
   patterning a semiconductor substrate to form preliminary pillars;
   forming a protection layer on each of the preliminary pillars;
   patterning the semiconductor substrate between the preliminary pillars to form pillar structures;
   sequentially forming a gate insulating material and a gate electrode material on the semiconductor substrate on which the pillar structures are formed;
   etching the gate insulating material and the gate electrode material and forming a gate insulating layer and a gate electrode on an outer sidewall of each of the pillar structures, wherein upper end levels of the gate insulating laver and the gate electrode are higher than a lower end of the protection layer; and
   forming a junction region by implanting an impurity into each of the pillar structures to a depth that is greater than a height of each of the preliminary pillars,
   wherein the upper end levels of the gate insulating laver and the gate electrode are coplanar, and
   wherein a portion of the protection laver, a portion of the gate insulating layer, a portion of the gate electrode, and a portion of the junction region overlap in a horizontal direction.

2. The method of claim 1, wherein the gate electrode is conformally formed on the outer sidewall of each of the pillar structures.

3. The method of claim 1, further comprising:
   implanting an impurity into the semiconductor substrate to form a common source region that will be electrically connected to the pillar structures.

4. A method of fabricating a semiconductor device, the method comprising:
   patterning a semiconductor substrate to form a preliminary trench;
   forming a protection layer on an inner sidewall of the preliminary trench;
   patterning the preliminary trench to form a trench in the semiconductor substrate;
   sequentially forming a gate insulating material and a gate electrode material on the semiconductor substrate in which the trench is formed;
   etching the gate insulating material and the gate electrode material and forming, to a certain depth, a gate insulating layer and a gate electrode in the trench, wherein upper end levels of the gate insulating layer and the gate electrode are higher than a lower end of the protection layer; and
   forming a junction region by implanting an impurity into the semiconductor substrate to a depth that is greater than a depth of the preliminary trench,
   wherein the upper end levels of the gate insulating laver and the gate electrode are coplanar, and
   wherein a portion of the protection layer, a portion of the gate insulating layer, a portion of the gate electrode, and a portion of the junction region overlap in a horizontal direction.

5. The method of claim 4, wherein the gate electrode is formed to fill the trench.

* * * * *